United States Patent [19]

Schade et al.

[11] Patent Number: 5,620,528
[45] Date of Patent: Apr. 15, 1997

[54] SOLAR CELL WITH A CONNECTING STRUCTURE

[75] Inventors: Reinhart Schade, Olching; Gerhard Lehner, Munich; Adolf Muenzer, Unterschleissheim; Friedrich-Wilhelm Schulze, Eching, all of Germany; Robert Wieting, Simi Valley, Calif.

[73] Assignees: Siemens Solar GmbH, Munich, Germany; Siemens Solar Industries International, Inc., Camarillo, Calif.

[21] Appl. No.: 533,985

[22] Filed: Sep. 27, 1995

[30] Foreign Application Priority Data

Sep. 30, 1994 [DE] Germany .................... 44 35 219.0

[51] Int. Cl.⁶ .................................................. H01L 31/05
[52] U.S. Cl. ............................................ 136/244; 136/256
[58] Field of Search ........................................ 135/244, 256

[56] References Cited

U.S. PATENT DOCUMENTS

| | | | |
|---|---|---|---|
| 3,375,141 | 3/1968 | Julius | 136/244 |
| 4,542,258 | 9/1985 | Francis et al. | 136/256 |
| 4,574,160 | 3/1986 | Cull et al. | 136/245 |
| 4,694,115 | 9/1987 | Lillington et al. | 136/256 |

FOREIGN PATENT DOCUMENTS

| | | | |
|---|---|---|---|
| 3237391 | 4/1983 | Germany | 136/256 |
| 55-34469 | 3/1980 | Japan | 136/244 |
| 57-84182 | 5/1982 | Japan | 136/244 |

*Primary Examiner*—Aaron Weisstuch
*Attorney, Agent, or Firm*—Hill, Steadman & Simpson

[57] ABSTRACT

A solar cell has electrical conductors applied on a pattern of electric contacts on a front surface and extending transversely relative thereto with a portion projecting beyond the edge of the solar cell. The formation of the electrical pattern includes at least two elongated portions interconnected by a return portion which extends beyond the one edge. This return portion provides a stiffening suitable for reliable interconnection to an additional solar cell to achieve a connection of two conductors in the projecting region.

14 Claims, 3 Drawing Sheets

SOLAR CELL WITH A CONNECTING STRUCTURE

BACKGROUND OF THE INVENTION

The electrical currents generated in a solar cell are outputted via electrical conductors that are in ohmic contact with the active semiconductor body of the solar cell. Depending on the cell type and on the direction of light incidence, these conductors, which are also referred to as contacts, can be composed of different materials. Whereas the selection of material and the shaping of the conductor of the back side of the solar cell is not problematical, the front side contacts must still assure an adequate light incidence into the semiconductor body.

Transparent, electrically conductive metal oxide layers (TCO) that can be produced by thin-film technology can be applied as front side contacts. As a consequence of their relatively low surface conductivity, however, these TCO contacts are reinforced or replaced by a structured, metallic front side contact or contact grid when higher currents are to be outputted. A structure for the grid is, therefore, desirable wherein an adequate overall grid contact cross section is distributed as uniformly as possible over the surface of the solar cell with a minimum occlusion thereof.

To that end, a finely branched or, respectively, tightly rastered, first grid contact structure is usually first applied on the front side. This is done, for example, with either a thin-film or thick-film technology. A bus structure that is at least composed of a conductor with adequate cross section, which is applied transversely thereto, is then applied on this first grid contact structure. The bus structure can, likewise, be produced by a thin-film technology, but thick-film technology is better. It is also possible to solder the bus structure in the form of solid metallic conductors onto the grid contact structure.

For external connection of crystalline or polycrystalline solar cells, conductor ribbons are soldered onto the bus structure at correspondingly provided terminal locations or pads. These also serve for the series connection of individual solar cells, wherein the conductor ribbons are respectively conducted under the back side of the neighboring solar cell and are soldered to the back side. Due to the mechanical sensivity of the grid contact structures, this had to be done manually and immediately before the interconnection in order to avoid tearing off or other damage. Due to the instability of the ribbon in view of bending, the positioning of the ribbon also requires high precision. A fully automated, cost-beneficial mass production or, respectively, mass interconnection of solar cells is thus made difficult.

SUMMARY OF THE INVENTION

The object of the present invention is to solve the problem wherein solar cell with simplified contacting allows a simpler interconnection without leading to additional occlusion of the front side of the solar cell and with which a more automated manufacturing and interconnection is possible.

This object and problem is inventively solved by a solar cell comprising a flat active semiconductor body with a diode structure, a back side metallization on the surface of the semiconductor body facing away from the incident light, a pattern of an electrical contact structure on a front surface of the semiconductor body, at least two solid electrical conductors which are interconnected together by a return bend portion and proceed transversely relative to the pattern that lie on the pattern and are electrically connected thereto, and said return bend portion projects beyond an edge of the semiconductor body.

An underlying idea of the invention is to insure that the electrical conductors serving for the interconnection of the solar cell on the front surface of the solar cell such that they project beyond the edge of the solar cell at one side and, preferably, that at least two of these conductors are connected to one another at their ends in the region projecting beyond the edge. At the front side or surface of the solar cell, the conductors are connected to a pattern of electrical contact structures and, for example, are soldered onto it. In that at least two of the self-supporting ends of the conductors are connected, these are stiffened compared to individual conductor leads or ends. The manipulation of the solar cell contacts in this way is thereby facilitated. The risk of bending the projecting ends is thereby considerably diminished. Thus it, also becomes possible to provide the solar cells with all necessary terminals at an early stage of manufacture. The interconnection of the solar cells to one another can then be undertaken in an arbitrary, later time at an arbitrary, other location. The stacking and transporting of the non-interconnected solar cells is free of problems associated with the applied contacts. The interconnection to form solar cell arrays or modules can be made directly on site and need no longer be carried out by the solar cell manufacturer. The soldering need no longer be carried out on the front side of the solar cell, and this is advantageous because the method step already harbors the risk of damage to the solar cell. With the invention, this method step can be relocated to the manufacturer of the solar cell and can occur, therefore, fully automated and, thus, cost-beneficially.

The interconnection by soldering of a plurality of solar cells of the invention is not problematic. A broad contacting region that allows a simple adjustment of the parts to be soldered and, thus, a simple interconnection of the solar cells to one another occurs due to the conductor ends that are connected to one another.

In a development of the invention, the electrical conductor comprises a round or oval cross section and is, thus, fashioned, for example, as a wire. Compared to a flat and, for example, ribbon-shaped conductor, a conductor having such a cross section produces less of an occlusion of the front surface of the solar cell given the same cross section.

The "connecting" of the "ends" of the conductors is realized in a further development of the invention in such a way that a single conductor piece is bent like a hair pin or U-shaped and is subsequently secured so that the front side of the solar cell that has the curved part projects beyond the edge of the solar cell. The conductor having an approximately round cross section is especially suitable for this version. The bent part of the conductor can, thus, comprise a uniform curvature and can be perfectly bent over at least one corner. The corners are thereby also rounded, whereby the inside angle can, for example, amount to 90°.

The plurality of conductors lying, for example, in parallel on the front surface of the solar cell is arbitrary and is determined by the size of the solar cell and is the result of an optimization between adequate conductor cross section, optimally low occlusion, and adequate mechanical stability. Since the conductors are preferably combined in pairs, an even-numbered plurality of conductors is preferred. For example, 4–10 copper wires or 2–5 conductor pairs or, respectively, wires are bent like a hair pin or U-shaped and have a diameter from 0.2 –0.5 mm are adequate as conductors for a solar cell that, for example, has been cut or was sawed from a crystalline silicon rod having a diameter of 140.5 mm, or approximately 6 inches.

It is provided in a further development of the invention that a single conductor, for example a single wire-shaped conductor, is secured in a meander-like or serpentine-like pattern on the front surface of the solar cell so that the loops formed by the meander or serpentine project beyond the edge of the solar cell on one side. These loops can also, in turn, comprise an approximately uniform curvature or be correspondingly adequately bent. The loops of the meander-shaped conductor, which are spaced from the one side, are preferably not salient and then lie on the solar cell.

In a further development of the invention, the electrical conductor is composed of a plurality of individual pieces, whose free ends project beyond the edge of the solar cell at one side and are connected, for example, are soldered thereat to an ohmic conductor that is arranged transversely thereto.

The pattern of the electrical contact structure forming the front side contacts can be applied in a traditional way. It can be composed of a network of fine lines that are in turn connected to one another with broader bus structures. The bus structure, in turn, comprises broadened contact locations or pads that are suitable for soldering the electrical conductor. The electrical conductor is preferably applied directly over the bus structure in order to keep the additional occlusion or masking of the surface due to the conductors as slight as possible.

The bus structure is preferably applied by thick-film technology or, respectively, the pads envisioned for connection can also be provided with a solder spot, for example by a flow soldering process or by applying solder paste.

The conductor itself is composed of a highly conductive material, for example copper. In one embodiment of the invention, the conductor is coated with tin. This facilitates the soldering, whereby less solder or solder paste is required or whereby additional solder agents or solder paste can potentially be completely eliminated.

The advantage of the inventive fashioning of the conductors serving the purpose of contacting the front side of the solar cells can be found not only in the mechanical stability of the individual cells, but is also present when the individual cells are interconnected to form a solar module or, respectively, solar cell array. The parts of the conductor that project beyond the solar cell edge and, for example, are bent like a hair pin or are well-suited for interconnection, for example by soldering, to additional connector means that extend between the solar cells to be interconnected.

The connector means can be additional conductor pieces that are applied to the back side of the solar cells, for example by soldering. These conductor pieces, likewise, comprise projecting ends and can be connected to the return bend portions of the conductors on the front side that project beyond the edge and that potentially are bent U-shaped or in some other way are connected to one another. The additional conductor pieces applied on the back side can, for example, be ribbons, i.e., conductor pieces having a rectangular cross section. However, the conductor pieces having an oval or round cross section are likewise suitable. These can also have the same shape as the conductors on the front side of the cell.

For interconnecting two neighboring solar cells, the loose ends of, for example, the straight conductor pieces can be soldered to the parts of the conductors that are bent or connected to one another. This arrangement has the advantage of an improved manufacturing tolerance. It is also possible that both conductors on the front side as well as the conductor pieces on the back side are respectively connected to one another. Since relatively broad, bent parts are available for soldering at least some of the conductors and conductor pieces to be joined when interconnecting two neighboring solar cells, the parts, such as the conductors and conductor pieces, to be joined to one another can overlap in a broad region at the soldering location. Since the soldering can occur with great latitude, a simple adjustment of the two solar cells relative to one another or relative to adjustment marks is possible.

The conductor pieces can also be applied on the back side of the solar cell and be bent meander-shaped, whereas at least the curved part of the conductor piece projects beyond the back side of the solar cell at one side.

A further advantage of the inventive solar cell occurs from the mechanical stability of the individual solar cells interconnected to form a solar cell array. The forces occurring due to the different coefficients of thermal expansion can be absorbed in a simple way by the projecting, bent parts without conductors or conductor pieces tearing off from the front side or, respectively, the back side of the solar cell. Given the traditional interconnection of solar cells by direct soldering of straight ribbons, this had to be compensated by providing a reserve length. To that end, the ribbons were folded, for example Z-shaped, between the solar cells. This is eliminated with the inventive solar cells so that these can be more densely arranged in the array, i.e., with less spacing between adjacent solar cells.

Additional possibilities of interconnecting the inventive solar cells include allowing the bent ends of the conductors to extend so far over the solar cell edge that they can be directly soldered onto the back side of the neighboring solar cell. This enables a plurality of contactings per conductor piece or U-shaped loop on the back side of the neighboring solar cell, for example by soldering or welding. The process dependability and, thus, the yield of the method are, thus, enhanced. By crimping the projecting parts of the conductors, an especially short distance or approximately 1.5 mm can be maintained in this way between interconnected solar cells. The edges of the neighboring solar cells can be aligned parallel to one another, even when the thick-film structures on the front side are applied twisted and not aligned in the proper angle. The outside interconnection of the solar cells or, respectively, of the wired solar cell array, however, can also be produced with an extension of the projecting end of the conductors. It can thereby be potentially necessary to shorten excessively long projecting parts of the conductor to the desired length.

Other advantages and features of the invention will be readily apparent from the following description of the preferred embodiments, the drawings and claims.

DESCRIPTION OF THE PREFERRED EMBODIMENTS

Figure 1:
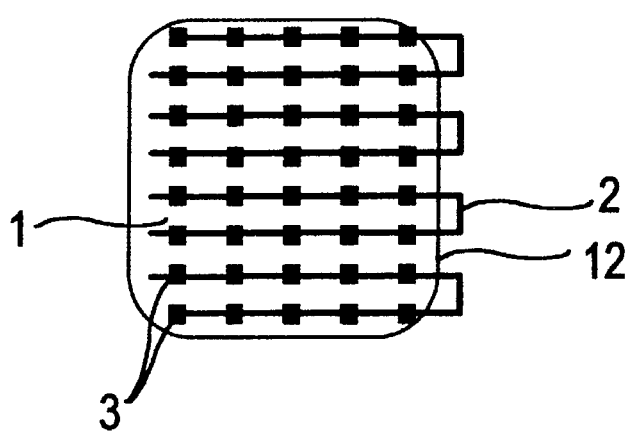
FIG. 1 is a front view of a solar cell having a first embodiment of conductors arranged thereon.

The principles of the present invention are particularly useful when incorporated in a solar cell 1 of FIG. 1 that has a pattern of electrical contacts. Conductors 2 of a conductor structure are bent U-shaped, are applied on the front surface, and are uniformly distributed on this front surface. The conductors 2 are connected to the pattern of the electrical contacts by soldering, with the pattern of electrical contacts being broadened by the solder points 3, and have a return bend portion extending beyond one edge 12 of the cell 1.

Figure 2:
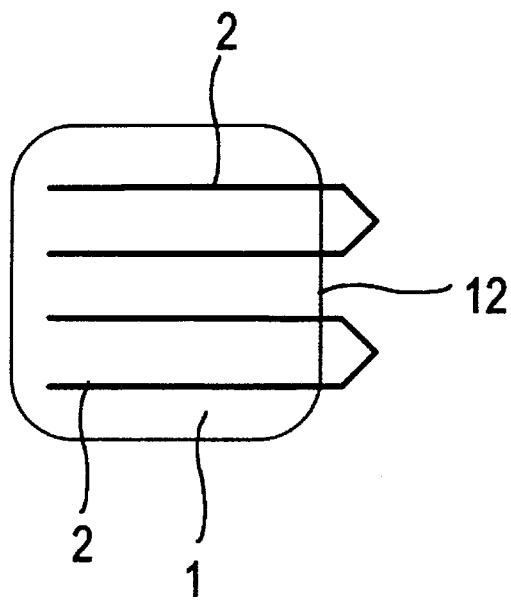
FIG. 2 is a front view of a solar cell having conductors of a second embodiment arranged thereon.
Figure 6:
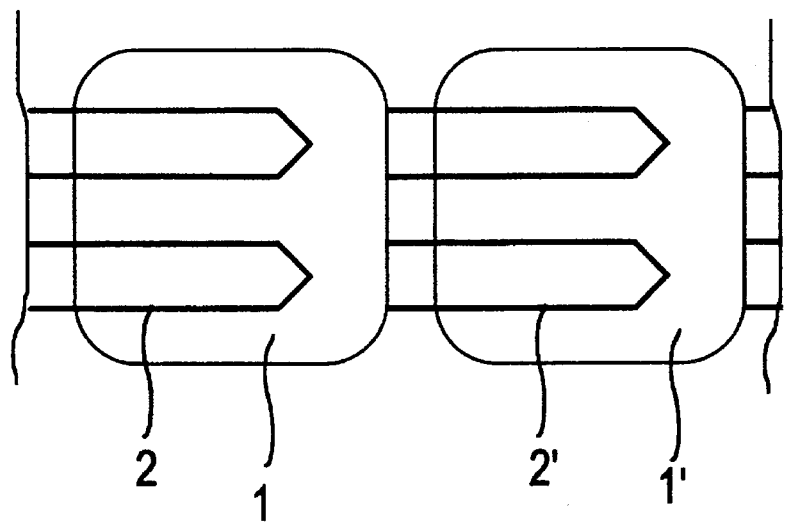
FIG. 6 is a back view of an embodiment of an array of solar cells of FIG. 2 interconnected together.

In FIG. 2, a variation of the embodiment of FIG. 1 is illustrated, wherein the conductors 2 are not bent U-shaped, but are bent acutely in the projecting part and are especially suited for direct contact on the back surface of an adjacent solar cell during interconnection, such as illustrated in FIG. 6.

Figure 3:
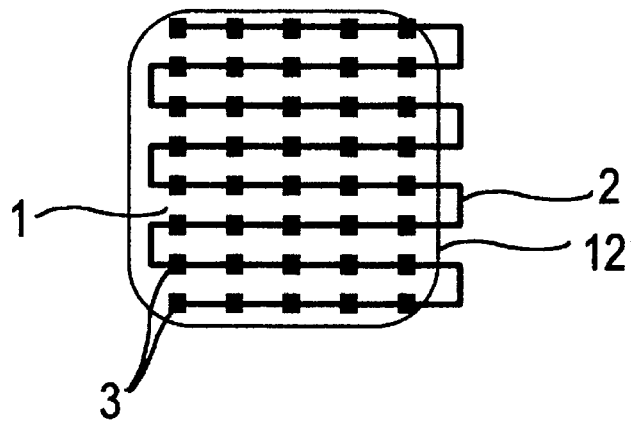
FIG. 3 is a front view of a solar cell having a third embodiment of a front conductor thereon.

FIG. 3 shows a third embodiment of a possible arrangement of the conductor 2 on the front surface of the solar cell 1 provided with a pattern of electrical contacts. The conductor 2 is composed of a single elongated conductor that is arranged in a meander-like or serpentine pattern on the front side of the solar cell 1. At the one edge 12 of the solar cell 1, shown on the right side in the Figure, the loops forming the serpentine or meander-like conductor 2 project beyond the edge 12 of the solar cell 1. The meander-shaped conductor of the wire can be manufactured in a simple way and cost-effective manner. Moreover, the positioning relative to the interconnect structure presents no problems in the solar cell production. The conductor 2 can also be secured on the pattern of electrical contacts, for example by soldering.

Figure 10:
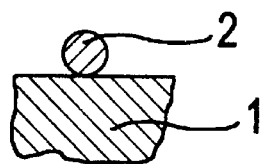
FIG. 10 is a partial cross sectional view of a solar cell with the conductor on the front surface.
Figure 11:
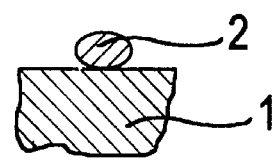
FIG. 11 is a partial cross sectional view of a modification of the connector on the front surface of a solar cell.

As illustrated in FIGS. 10 and 11, the conductor 2 can either have a circular cross section, as shown in FIG. 10, or have an oval cross section, as shown in FIG. 11.

Figure 4:
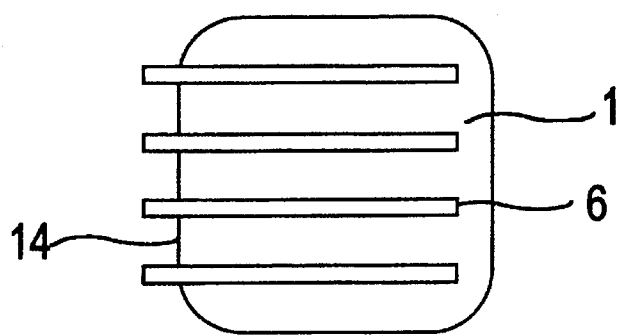
FIG. 4 is a back view of a solar cell illustrating the arrangement of conductor strips on the back surface.

The back surface of the solar cell 1 is provided with either a back surface metallization that can be surface-wide or likewise structured. Conductor strips 6, which are for example short metal ribbons that project beyond an edge 14 of the solar cell 1, are applied over the back side metallization, as shown in FIG. 4.

Figure 7:
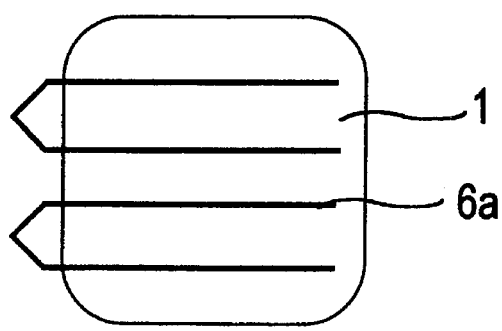
FIG. 7 is a back view of a modification of the conductor strips on the back surface of a solar cell.
Figure 8:
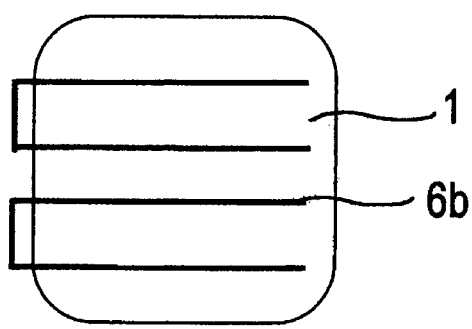
FIG. 8 is a back view of a solar cell with another modification of the conductor strips on the back surface.
Figure 9:
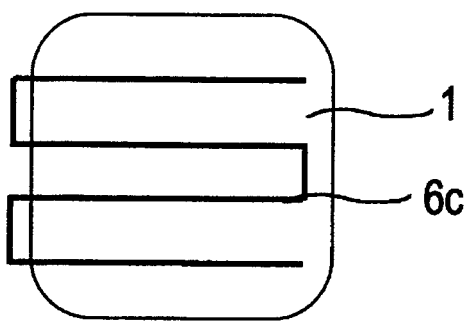
FIG. 9 is a back view of a third modification of the conductor strips on the back surface of the solar cell.

It is also possible to fashion the conductor strips 6 on the back surface in conformity with the conductor sections 2 on the front side. Accordingly, the strips 6 can be in a shape of an acute bend as the conductor 6a of FIG. 7 or can have a U-shaped return bend as the conductor 6b of FIG. 8 or have a serpentine shape as the conductor 6c of FIG. 9.

Figure 5:
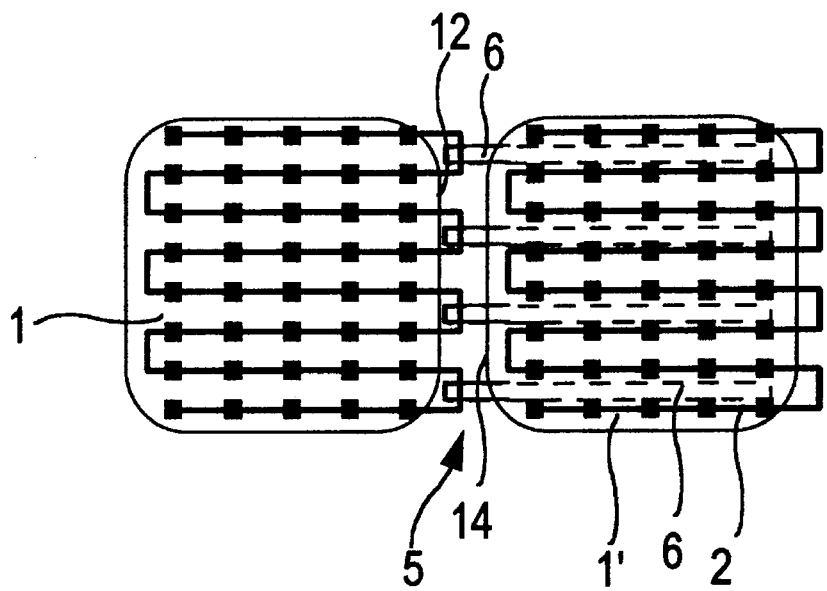
FIG. 5 is a front view of an array of a pair of solar cells of FIG. 3 interconnected together in accordance with the present invention.

Two solar cells can be interconnected as illustrated in FIG. 5 to form an array by having a solar cell 1 with an electrical conductor 2 on a front surface connected to conductor strips 6 on the back surface of the identical solar cell 1'. The solar cells are arranged side-by-side so that the ends of the conductor strips 6 projecting beyond the edge 14 of the solar cell 1' overlap with the loops of the conductors 2 that are applied on the front surface of the first solar cell 1 and project beyond the edge 12. As may be seen from the Figure, a large overlapping region 5 exists for the parts which are contacted. The loops of the conductors 2 overlap the projecting ends of the conductor pieces 6 between two solar cells in this region. For fixing, the corresponding ends are soldered between the solar cells 1 and 1', respectively. In a corresponding way, the two solar cells joined in this way can be joined or, respectively, interconnected to an arbitrary plurality of additional identical solar cells. It is thus possible to fashion an array of an endless chain of solar cells. It is better, however, to arrange a specific plurality of solar cells on a module overlapping in the desired way and to connect them to one another by soldering. For example, it is thus also possible to turn the alignment of the conductors 2 by 90° compared to the alignment of the conductor strips 6 on the back side of the solar cell so that the two solar cells can be connected to one another diagonally. Thus, a meander-shaped occupation of the module with a single chain of solar cells is possible.

It is also possible to interconnect a pair of solar cells as illustrated in FIG. 6, wherein the connecting conductors 2 on the front surface are fashioned in the manner of the conductors 2 of FIG. 2 and are extended to extend a greater distance beyond the one edge 12. They are then soldered to the back surface of a neighboring solar cell and, as illustrated in FIG. 6, the conductors 2' of the first solar cell 1 are fashioned longer in the projecting region and are soldered onto the back side of the neighboring solar cell 1'. The projecting conductors 2 of an additional neighboring cell (not shown) are soldered on the back side of the first solar cell 1.

Although various minor modifications may be suggested by those versed in the art, it should be understood that we wish to embody within the scope of the patent granted hereon all such modifications as reasonably and properly come within the scope of our contribution to the art.

We claim:

1. A solar cell comprising a flat, active semiconductor body with a diode structure having a front surface and a back surface, a plurality of conductor strips being soldered to the back surface of the semiconductor body facing away from the light, a pattern of electrical contacts on the front surface of the semiconductor body, and a conductor structure comprising a single, continuous, solid electrical conductor having a serpentine shape with parallel straight portions and loops, said conductor structure being disposed to proceed transversely of the pattern of electrical contacts and being electrically connected thereto with loops of the serpentine shape on one side projecting beyond a first edge of the semiconductor body.

2. A solar cell according to claim 1, wherein the pattern of the electrical contacts is at least partially set into the surface of the semiconductor body.

3. A solar cell according to claim 1, wherein the conductor structure is soldered on the pattern of electrical contacts.

4. A solar cell according to claim 1, wherein the electrical conductor has a round cross section.

5. A solar cell according to claim 1, wherein the electrical conductor has an oval cross section.

6. A solar cell according to claim 1, wherein the loops of the conductor structure projecting beyond the first edge of the semiconductor body comprise a solder location for a series of interconnections of said solar cell to at least one additional identical solar cell to form an array of solar cells.

7. A solar cell according to claim 1, wherein the plurality of conductor strips soldered on the back surface of the semiconductor body have return bend portions interconnecting two adjacent conductor strips extending from a second edge of the body.

8. A solar cell according to claim 1, wherein the plurality of conductor strips soldered on the back surface of the semiconductor body are straight portions of a single wire having a serpentine form with return bend portions of the serpentine form adjacent one side extending beyond a second edge of the body for connecting to an adjacent solar cell.

9. A solar cell according to claim 1, wherein the plurality of conductor strips soldered on the back surface of the semiconductor body project beyond a second edge of the body.

10. A solar cell comprising a flat, active semiconductor body with a diode structure having a from surface and a back surface, a plurality of conductor strips having a U shape with two straight portions interconnected by a return bend being soldered on the back surface of the semiconductor body facing away from the light with the return bends extending from a first edge of the body, a pattern of electrical contacts on the front surface of the semiconductor body, a conductor structure comprising at least two solid electrical conductors proceeding transversely relative to the pattern and interconnected together at one end by a return bend portion, said conductor structure being disposed on the pattern and being electrically connected thereto with the return bend portion projecting beyond a second edge of the semiconductor body.

11. A solar cell according to claim 10, wherein the second edge is opposite the first edge.

12. An array of solar cells, with each solar cell comprising a flat active semiconductor body with a diode structure with a back surface and a front surface, a back surface metallization on the back surface of the semiconductor body facing away from the light, a first conductor structure disposed on the back side metallization and having a portion extending beyond a first edge thereof, a pattern of electrical contacts on a front surface of the semiconductor body, a second conductor structure disposed on the pattern of electrical contacts and connected thereto, said second conductor structure having a serpentine structure with straight portions connecting return bend portions and with more than two return bend portions extending beyond a second edge of the body; and adjacent solar cells being interconnected by the return bend portion of the second conductor structure on the pattern of the electrical contacts of one cell being interconnected to the portions of the first conductor structure on the back surface of the adjacent cell.

13. An array according to claim 12, wherein the first conductor structure has a plurality of conductor strips having two straight portions connected by a return portion which is the portion extending beyond the first edge.

14. An array according to claim 12, wherein the second edge is opposite the first edge.

* * * * *